United States Patent [19]

Butson

[11] Patent Number: 4,591,818

[45] Date of Patent: May 27, 1986

[54] COIL ARRANGEMENT FOR GENERATING A HIGH FREQUENCY MAGNETIC FIELD

[75] Inventor: Peter C. Butson, Harrow, England

[73] Assignee: Picker International Limited, Middlesex, England

[21] Appl. No.: 680,979

[22] Filed: Dec. 12, 1984

[30] Foreign Application Priority Data

Dec. 23, 1983 [GB] United Kingdom ............... 8334374

[51] Int. Cl.[4] .............................................. H01F 5/00
[52] U.S. Cl. ..................................... 335/299; 324/320
[58] Field of Search ............... 335/216, 299; 324/318, 324/319, 320

[56] References Cited

U.S. PATENT DOCUMENTS

| | | |
|---|---|---|
| 4,095,168 | 6/1978 | Hlavka . |
| 4,284,950 | 8/1981 | Burl et al. ............................ 324/320 |
| 4,320,342 | 3/1982 | Heinzerling . |
| 4,339,718 | 7/1982 | Bull et al. ......................... 324/320 X |
| 4,398,150 | 8/1983 | Barjhoux et al. ................... 324/319 |
| 4,467,282 | 8/1984 | Siebold . |
| 4,506,224 | 3/1985 | Krause . |
| 4,509,011 | 4/1985 | Sugimoto et al. ................... 324/318 |

FOREIGN PATENT DOCUMENTS 2806447 2/1978 Fed. Rep. of Germany .
3131946A1 8/1981 Fed. Rep. of Germany .

Primary Examiner—George Harris
Attorney, Agent, or Firm—Watts, Hoffmann, Fisher & Heinke

[57] ABSTRACT

A coil arrangement for generating a high frequency magnetic field in a generally cylindrical volume, e.g. for use in an NMR imaging apparatus, comprises a plurality of conductors (11, 13, 15, 17, 19) extending generally parallel to the axis of the volume at spaced positions around the volume and connection means (25, 27, 29) whereby the conductors are connected in electrically parallel paths for energization from a common source (S). The paths are arranged to have a high self-resonant frequency compared with the frequency of the source, e.g. by being arranged each to comprise a single turn only, and the impedances of the paths are arranged to differ so that when energized the fields produced by the individual conductors combine to produce a resultant desired field distribution. By having parallel paths of high self-resonant frequency and different impedance the difficulty of providing a sufficient number of series connected turns distributed so as to obtain a desired field distribution without having a low self-resonant frequency is avoided.

11 Claims, 5 Drawing Figures

COIL ARRANGEMENT FOR GENERATING A HIGH FREQUENCY MAGNETIC FIELD

This invention relates to coil arrangements.

More especially the invention relates to coil arrangements suitable for producing radio frequency (RF) magnetic fields within a volume embraced by the coil arrangement.

One particular application of such a coil arrangement is in nuclear magnetic resonance (NMR) imaging apparatus. In such apparatus nuclear magnetic resonance is excited in a body to be imaged by applying to the body an RF magnetic field in a direction transverse to the direction of a static magnetic field applied to the body. It is normally desirable for the applied RF magnetic field to be uniform throughout the body, or at least to vary across the body in a uniform manner, e.g. have imposed on it a linear gradient. After excitation the same coil arrangement is used to detect the excited nuclear magnetic resonance, and it will be understood that, by the principle of reciprocity, a coil arrangement capable of generating a uniform field is particularly suitable for detection.

For the production of a uniform RF magnetic field in NMR imaging apparatus a so-called saddle coil arrangement is conventionally used, one such arrangement being illustrated diagrammatically in FIG. 1 of the accompanying drawings. The arrangement comprises two similar halves A and B each comprising several saddle-shaped turns 1, 3, 5 and 7 disposed one within the other, the two halves being positioned on opposite sides of, and on the curved surface of, a tubular volume in which the body to be imaged is placed in use of the apparatus. In FIG. 1 only two turns 1 and 3 or 5 and 7 are shown in each half for the sake of clarity. Each turn is thus disposed with its two straight parts extending parallel to the axis of the volume, which straight parts are distributed around the axis of the volume as further described below. The turns 1 and 3 or 5 and 7 in each half are connected in series, as shown in FIG. 1, and the two halves are driven in parallel from a common RF source (not shown). Thus in use the current in the straight parts of the turns lying on one side of a plane containing the axis of the volume and bisecting the coils is in the opposite direction to the current in the straight parts of the turns lying on the other side of the plane, and the current in all the turns is of the same amplitude. The resulting field is directed parallel to the abovementioned plane, perpendicular to the axis of the volume, and if the field is to be uniform, the current distribution, i.e. the distribution of the straight parts of the turns, around the axis must be approximately sinusoidal.

In such an arrangement, in order to ensure that the same current flows in all the turns and so produce the required field distribution, the self resonant frequency of each half of the coil arrangement must be high compared with the frequency of the applied RF current. This leads to the difficulty that for operation at a relatively high radio frequency the number of turns must be very small, i.e. too small to obtain a current distribution approximating to sinusoidal.

It is an object of the present invention to provide a coil arrangement whereby the above described difficulty may be overcome.

According to the present invention there is provided a coil arrangement for generating a high frequency magnetic field in a generally cylindrical volume comprising: a plurality of conductors extending generally parallel to the axis of the volume and disposed at spaced positions around the volume; and connection means whereby the conductors are connected in electrically parallel paths for energisation from a common source, the self-resonant frequency of each path being high compared with the frequency of said source, and the impedances of the parallel paths differing so that the fields produced by the individual conductors when energised combine to produce a resultant field in the volume of a desired distribution.

Preferably each said parallel path comprise a single turn.

In one particular arrangement in accordance with the invention, suitable for use where the desired distribution is a uniform distribution, the parallel paths are connected to said source so that the current in the conductors lying on one side of a plane bisecting the volume and containing its axis is in the opposite direction to the current in the conductors lying on the other side of said plane, and the impedances of the parallel paths vary inversely with the distances of the conductors from said plane.

In one such arrangement the conductors on one side of the said plane are in mirror image positions with respect to the conductors on the other side of said plane. The conductors on each side of said plane in such an arrangement are suitably at equally spaced angular positions around the axis of the volume.

The required variation of the impedances of the parallel paths may be obtained by virtue of said conductors themselves having different impedances, and/or by impedances of different values being connected in series with at least some of said conductors.

BRIEF DESCRIPTION OF THE DRAWINGS

Several coil arrangements in accordance with the invention will now be described, by way of example, with reference to the FIGS. 2 to 5 of the accompanying drawings is which:

Referring to FIGS. 2 and 3, the first arrangement to be described comprises five pairs of conductors 11A; 11B; 13A; 13B; 15A; 15B; 17A; 17B and 19A; 19B disposed around the curved surface of a tubular volume. The conductors all extend parallel to the axis of the volume, with the conductors of each pair at mirror image positions with respect to a plane 21 containing the axis of the volume and bisecting the volume at right angles to the plane 23 of the central conductors 15A, 15B. The conductors on each side of the plane 21 are at respective angles of 30°, 60°, 90°, 120° and 150° with respect to the plane 21, i.e. at equally angular spaced positions around the curved surface of the half the volume on that side of the plane 21.

Figure 1:
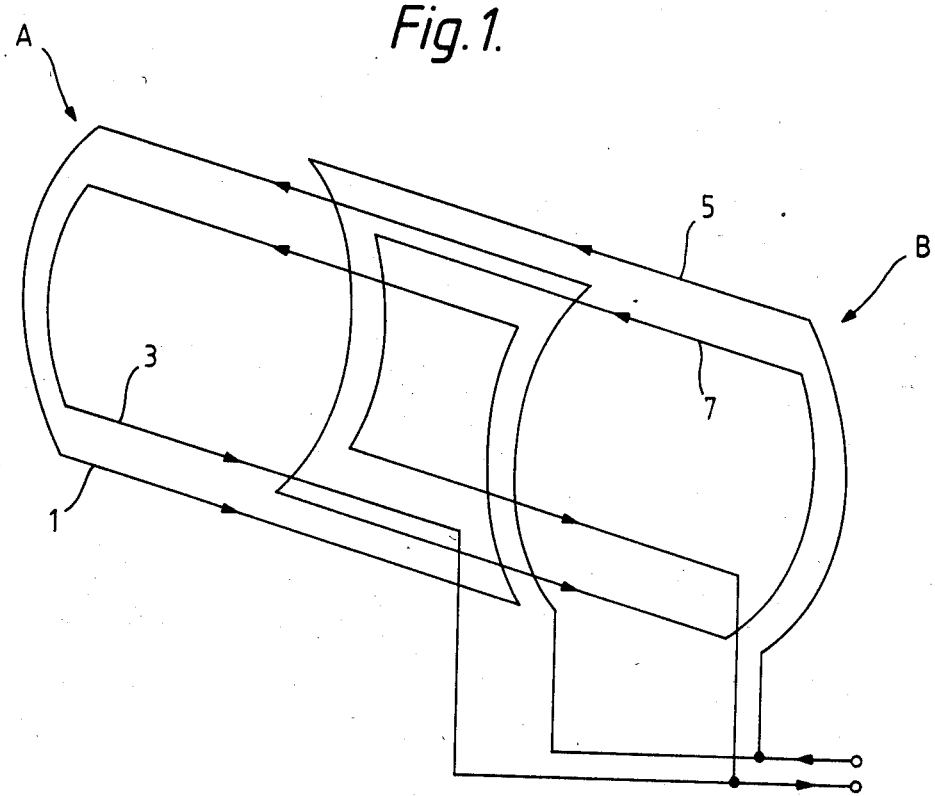
FIG. 1 is a conventional coil used in NMR imaging apparatus

At one end all the conductors are electrically connected together by a metal ring 25 of rectangular cross-section. At their other ends the five conductors 11A to 19A on one side of the plane 21 are electrically connected together by a metal half ring 27, of rectangular cross-section, and the other five conductors 11B to 19B are electrically connected together by a second metal half ring 29 of rectangular cross-section.

In use the coil arrangement is energised by a source S connected between the half rings 27 and 29 so that the current in the conductors 11A to 19A is in the opposite direction to the current in the conductors 11B to 19B. Thus the field produced in use is in a direction perpendicular to the plane 23.

It will be appreciated that the coil arrangement effectively comprises five parallel paths connected across the source S each having only one turn. Hence the inductance of each path can easily be arranged to be low so that the self resonant frequency of each path is high compared with the frequency of the source S.

In order for the field produced to be uniform it is necessary for the amplitudes of the currents in the conductors to vary sinusoidally around the volume so that the current in conductors 11 and 19 is proportional to sin 30°, in conductors 13 and 17 is proportional to sin 60°, and in conductors 15 is proportional to sin 90°.

In accordance with the invention this is achieved by making the parallel paths in which the conductors are connected across the source of appropriately different impedance, i.e. have impedances which vary inversely with their distance from the plane 21.

Figure 2:
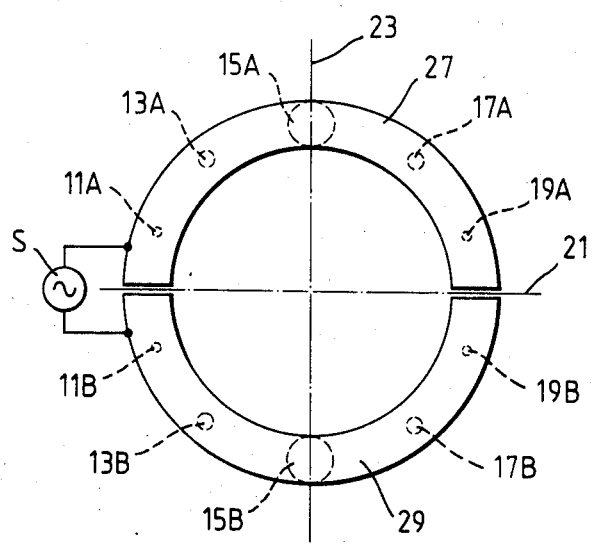
FIGS. 2 and 3 are respectively diagrammatic end and plan views of a first coil arrangement.
Figure 3:
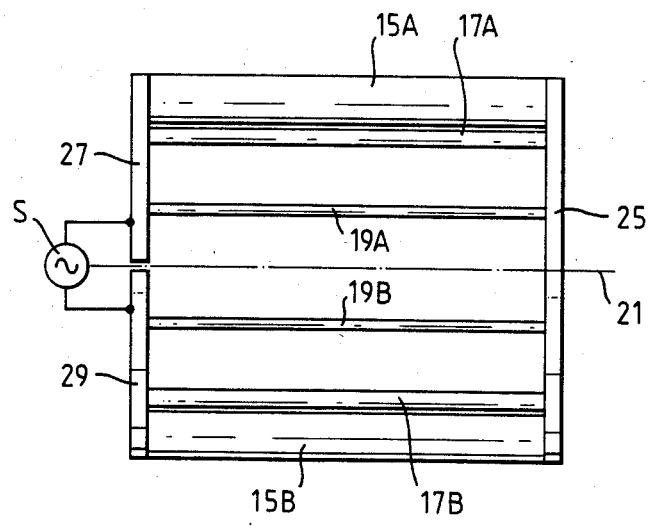

In the embodiment of FIGS. 1 to 3 this is achieved by making the conductors of different diameters, i.e. by making the conductors themselves of different impedance, more particularly inductance.

In one particular coil arrangement of the form shown in FIGS. 1 to 3 suitable for use in an NMR imaging apparatus with a source of frequency of the order of 60 MHz the conductors are of length 400 mms, the rings are of internal and external radius 205 mms and 235 mms respectively and of axial thickness 10 millimeters. The conductors 11 and 19 have a diameter of 0.6 mms, the conductors 13 and 17 have a diameter of 10 millimeters and the conductors 15 have a diameter of 20 millimeters.

As will be seen, a large difference in the diameter of the conductors is required in order to produce the required difference in current.

This difficulty may be overcome in other arrangements in accordance with the invention by alternatively or additionally inserting impedances, normally inductances, of appropriate values in series with the conductors.

Figure 4:
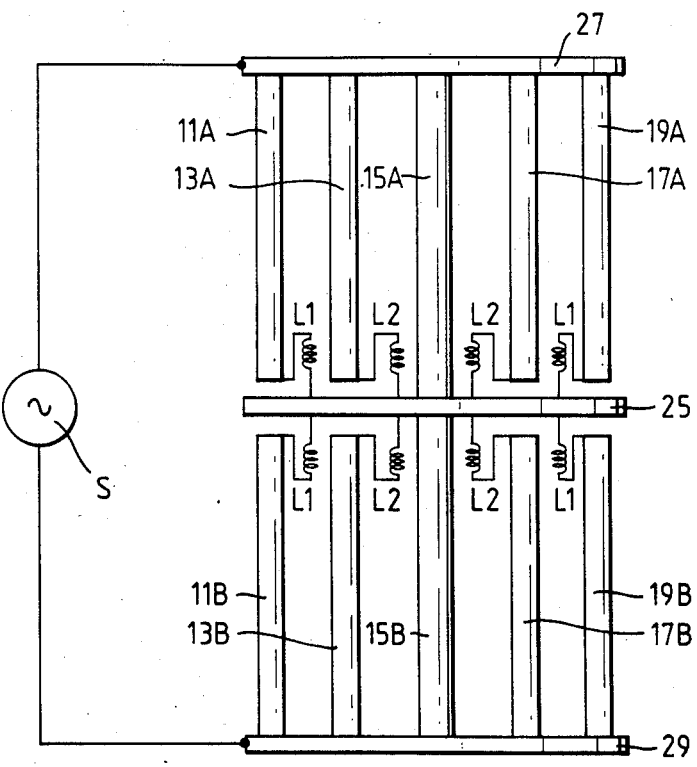
FIG. 4 is a diagram illustrating a second coil arrangement.

One such arrangement is illustrated in FIG. 4 wherein the coil arrangement is shown opened out and flattened with the ring 25 between the two sets of conductors 11A; 13A; 15A; 17A; 19A and 11B; 13B; 15B; 17B and 19B to show more clearly the positions of the inserted inductances. In this arrangement each of the conductors 11A; 11B; 13A; 13B; 17A; 17B; 19A and 19B is insulated at one end from the adjacent ring e.g. ring 25 in FIG. 4, and the insulation bridged by an inductor L1 in the case of conductors 11 and 19 and an inductor L2 in the case of conductors 13 and 17.

Figure 5:
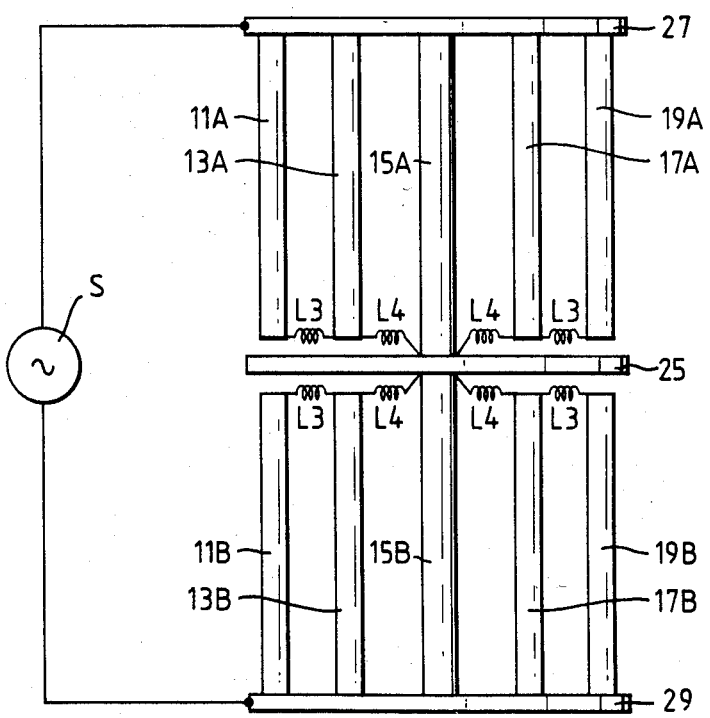
FIG. 5 is a diagram illustrating a third coil arrangement.

In a further arrangement illustrated in FIG. 5, the conductors 11A; 11B; 13A; 13B; 17A; 17B; 19A and 19B are again insulated at one end from the adjacent ring e.g. ring 25 in FIG. 5, and an inductor L4 connected between the insulated end of each of the conductors 13 and 17 and the corresponding ends of conductors 15 and an inductor L3 connected the insulated ends of conductors 11 and 13, and conductors 17 and 19.

In a modification (not shown) of the arrangements described above with reference to FIGS. 4 and 5 inductors are connected at each end of each of the conductors 11, 13, 17 and 19.

In the arrangements of FIGS. 4 and 5 the conductors 11 and 19 are shown to have the same diameter, i.e. to themselves have substantially the same impedance. However, it will be appreciated that in other arrangements this need not be the case, the required variation in impedance, and hence current, being obtained partly by virtue of variation of the diameters and hence the impedances of the conductors 11 and 19 themselves and partly by virtue of inserted impedances.

It will further be appreciated that whilst in the coil arrangements in accordance with the invention described above by way of example the conductors are equally spaced, this need not to be the case in a coil arrangement in accordance with the invention. Thus, whilst in the coil arrangements described by way of example a sinusoidal current distribution is obtained by using equally spaced conductors in parallel paths of different impedance, in other arrangements a desired current distribution may be obtained using a combination of differences in the impedances of the parallel paths and the spacings between the conductors. One example of such an arrangement is a coil arrangement of relatively short axial length wherein a departure from a sinusoidal current distribution may be required to obtain a uniform field.

I claim:

1. A coil arrangement for generating a high frequency magnetic field in a generally cylindrical volume comprising: a plurality of conductors extending generally parallel to the axis of the volume and disposed at spaced positions around the volume; and connection means whereby the conductors are connected in electrically parallel paths for energisation from a common source; the self-resonant frequency of each path being high compared with the frequency of said source, and the impedances of the parallel paths differing so that the fields produced by the individual conductors when energised combine to produce a resultant field in the volume of a desired distribution.

2. An arrangement according to claim 1 wherein each said parallel path comprises a single turn.

3. An arrangement according to claim 1 wherein the parallel paths are connected to said source so that the current in the conductors lying on one side of a plane bisecting the volume and containing its axis is in the opposite direction to the current in the conductors lying on the other side of said plane, and the impedances of the parallel paths vary inversely with the distances of the conductors from said plane.

4. An arrangement according to claim 3 wherein the conductors on one side of the said plane are in mirror image positions with respect to the conductors on the other side of said plane.

5. An arrangement according to claim 4 wherein the conductors on each side of said plane are at equally spaced angular positions around the axis of the volume.

6. An arrangement according to claim 3 wherein said connection means comprises a first connector which electrically connects together one end of all said conductors and two second connectors one of which connects together the other ends of the conductors lying on one side of said plane, and the other of which connects together the other ends of the conductors lying on the other side of said plane.

7. An arrangement according to claim 6 wherein said first connector is of circular form and said second connectors are of semi-circular form.

8. An arrangement according to claim 1 wherein the required differences of the impedances of the parallel paths is obtained at least partly by virtue of said conductors themselves having different impedances.

9. An arrangement according to claim 8 wherein said conductors have different impedances by virtue of having different cross-sectional areas.

10. An arrangement according to claim 1 wherein the required variation of the impedances of the parallel paths is obtained at least partly by virtue of impedances of different values connected in said paths in series with at least some of said conductors.

11. An arrangement according to claim 10 wherein said impedances connected in said paths in series with said conductors are inductances.

* * * * *